(12) United States Patent
Kim et al.

(10) Patent No.: US 8,507,923 B2
(45) Date of Patent: Aug. 13, 2013

(54) LIGHT EMITTING DIODE PACKAGE

(75) Inventors: Dae Won Kim, Ansan-si (KR); Dae Sung Kal, Ansan-si (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 1061 days.

(21) Appl. No.: 12/174,054

(22) Filed: Jul. 16, 2008

(65) Prior Publication Data

US 2009/0109151 A1     Apr. 30, 2009

(30) Foreign Application Priority Data

Oct. 29, 2007  (KR) .................. 10-2007-0108687

(51) Int. Cl.
*H01L 27/30*     (2006.01)
(52) U.S. Cl.
USPC .................................. 257/79; 257/88; 257/89
(58) Field of Classification Search
None
See application file for complete search history.

(56) References Cited

U.S. PATENT DOCUMENTS

| | | | | |
|---|---|---|---|---|
| 5,187,377 | A | * | 2/1993 | Katoh .............................. 257/89 |
| 5,808,592 | A | * | 9/1998 | Mizutani et al. ................. 345/83 |
| 2002/0139987 | A1 | * | 10/2002 | Collins et al. ................... 257/88 |
| 2004/0080941 | A1 | * | 4/2004 | Jiang et al. ..................... 362/252 |
| 2005/0057144 | A1 | * | 3/2005 | Morita et al. .................. 313/501 |
| 2006/0124943 | A1 | * | 6/2006 | Li et al. .......................... 257/94 |
| 2006/0180818 | A1 | * | 8/2006 | Nagai et al. ..................... 257/89 |
| 2006/0285324 | A1 | * | 12/2006 | Ansems et al. ............... 362/231 |
| 2007/0115228 | A1 | * | 5/2007 | Roberts et al. .................. 345/82 |

FOREIGN PATENT DOCUMENTS

| | | |
|---|---|---|
| JP | 2004-006582 | 1/2004 |
| WO | 2004-023568 | 3/2004 |

* cited by examiner

*Primary Examiner* — Fei Fei Yeung Lopez
(74) *Attorney, Agent, or Firm* — H.C. Park & Associates, PLC

(57) ABSTRACT

A light emitting diode (LED) package includes a first serial array of light emitting cells formed on a first substrate to emit light of a relatively short wavelength, and a second serial array of light emitting cells formed on a second substrate to emit light of a relatively long wavelength. The first and second serial arrays are connected to in reverse parallel. The LED package is capable of being operated under AC power and emitting white light with excellent color reproduction characteristics and luminous efficiency.

9 Claims, 6 Drawing Sheets

LIGHT EMITTING DIODE PACKAGE

CROSS REFERENCE TO RELATED APPLICATION

This application claims priority from and the benefit of Korean Patent Application No. 10-2007-0108687, filed on Oct. 29, 2007, which is incorporated by reference for all purposes as if fully set forth herein.

BACKGROUND OF THE INVENTION

1. Field of the Invention

The present invention relates to a light emitting diode package, and more particularly, to a light emitting diode package capable of emitting light of a mixed color and being driven under AC power.

2. Discussion of the Background

Since development of GaN-based light emitting diodes (LEDs), the GaN-based LEDs have considerably changed LED technologies and are currently used in a variety of applications such as full-color LED display devices, LED traffic lights and white LEDs. High-efficiency white LEDs are expected to become a substitute for fluorescent lamps. Particularly, the efficiency of the white LEDs has reached the level similar to that of typical fluorescent lamps.

In general, an LED emits light by forward current and receives a supply of a direct current (DC) power source. Hence, if the LED is connected directly to an alternating current (AC) power source, the LED is repeatedly turned on and off depending on the direction of current. As a result, the LED does not continuously emit light and may be easily broken by reverse current.

In order to solve such a problem, an LED capable of being directly connected to a high-voltage AC power source is disclosed in International Application Publication No. WO 2004/023568(A1), entitled "LIGHT-EMITTING DEVICE HAVING LIGHT-EMITTING ELEMENTS" by SAKAI et al.

According to International Application Publication No. WO 2004/023568(A1), LEDs (i.e., light emitting cells) are connected in series on a single insulating substrate such as a sapphire substrate to form LED arrays. Two LED arrays are connected to each other in reverse parallel on the sapphire substrate. As a result, a single-chip light emitting device capable of being directly driven by an AC power supply is provided. Since the single-chip light emitting device is fabricated of a GaN-based compound to emit ultraviolet or blue light, the single-chip light emitting device and a phosphor may be combined to provide an LED package for emitting mixed-color light such as white light.

For example, a white LED package can be implemented by combining a single-chip light emitting device for emitting blue light, a phosphor for emitting yellow light by wavelength-converting blue light or phosphors for emitting green light and red light. However, white light produced from the combination of the blue light emitting device and the yellow phosphor may have poor color reproduction characteristics, and use of the green and red phosphors may cause luminous efficiency to be lowered due to the excessive use of the phosphors.

SUMMARY OF THE INVENTION

The present invention provides an LED package capable of emitting mixed-color light and being driven under AC power, particularly high-voltage AC power.

The present invention also provides an LED package capable of implementing white light having excellent color reproduction characteristics and luminous efficiency.

Additional features of the invention will be set forth in the description which follows, and in part will be apparent from the description, or may be learned by practice of the invention.

The present invention discloses an LED package including a first serial array of light emitting cells formed on a first substrate to emit light of a relatively short wavelength, and a second serial array of light emitting cells formed on a second substrate to emit light of a relatively long wavelength. In addition, the first serial array and the second serial array are connected in reverse parallel. Accordingly, an LED package capable of emitting mixed-color light and being operated under AC power is provided.

Here, the "light emitting cell" means a diode as a unit element emitting light in operation. The "serial array" means an array in which light emitting cells are sequentially connected so that when a voltage is applied to both ends of the array, a forward or reverse voltage is applied to all the light emitting cells in the array. The "reverse parallel" connection means a connection in which if a voltage is applied to both ends of arrays connected in parallel, a forward voltage is applied to one serial array, and a reverse voltage is applied to the other serial array.

Meanwhile, the LED package may further include a phosphor for wavelength converting at least a portion of light emitted from the first serial array. Accordingly, a mixed-color light can be emitted through combination of the first and second serial arrays and the phosphor.

In some embodiments, the light emitting cells in the first serial array may emit blue light, the light emitting cells in the second serial array may emit red light, and the phosphor may wavelength-convert blue light into green light. In other embodiments, the light emitting cells in the first serial array may emit blue light, the light emitting cells in the second serial array may emit green light, and the phosphor wavelength-convert blue light into red light. Accordingly, white light with excellent color reproduction characteristics and luminous efficiency can be implemented.

In addition, the LED package may further include a molding member covering the first and second serial arrays, and the molding member may contain a diffusing agent. The diffusing agent allows a uniform mixed-color light to be radiated to the outside by mixing lights emitted from the serial arrays. The phosphor may be contained in the molding member.

Meanwhile, each of the light emitting cells in the first serial array comprises a first conductive-type semiconductor layer, a second conductive-type semiconductor layer and a first active layer interposed therebetween. The first active layer may be formed of an AlIGaN-based compound. In addition, each light emitting cell in the second serial array includes a first conductive-type semiconductor layer, a second conductive-type semiconductor layer, and a second active layer interposed therebetween, wherein the second active layer may be formed of an AlInGaP-based compound.

Both the foregoing general description and the following detailed description are exemplary and explanatory and are intended to provide further explanation of the invention as claimed.

BRIEF DESCRIPTION OF THE DRAWINGS

The above and other objects, features and advantages of the present invention will become apparent from the following description of exemplary embodiments given in conjunction with the accompanying drawings, in which.

DETAILED DESCRIPTION OF THE ILLUSTRATED EMBODIMENTS

Figure 1:
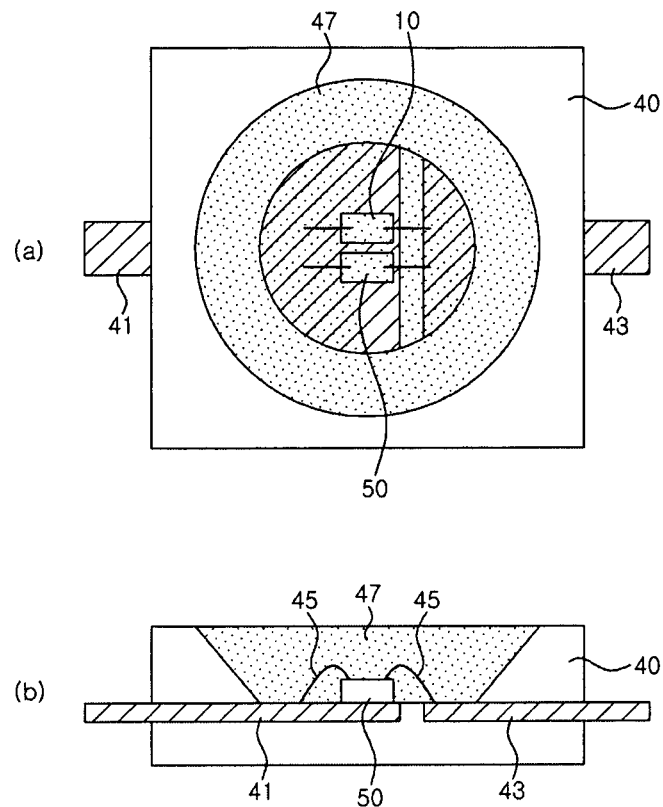
FIG. 1(a) and FIG. 1(b) respectively show a plan view and a sectional view illustrating an LED package according to an embodiment of the present invention.

Hereinafter, exemplary embodiments of the present invention will be described in detail with reference to the accompanying drawings. The following embodiments are provided only for illustrative purposes so that those skilled in the art can fully understand the spirit of the present invention. Therefore, the present invention is not limited to the following embodiments but may be implemented in other forms. In the drawings, the widths, lengths, thicknesses and the like of elements may be exaggerated for convenience of illustration. Like reference numerals indicate like elements throughout the specification and drawings.

Figure 2:
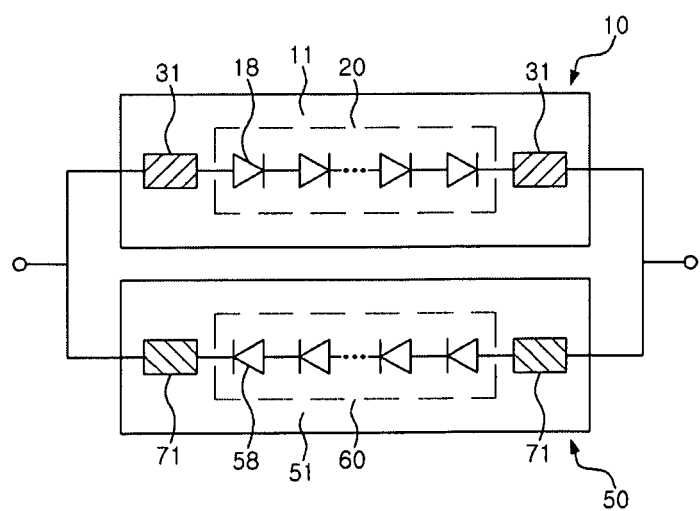
FIG. 2 is a schematic view illustrating the LED package according to an embodiment of the present invention.

FIG. 1(a) and FIG. 1(b) respectively show a plan view and a sectional view illustrating an LED package according to an embodiment of the present invention, and FIG. 2 is a schematic view illustrating the LED package according to an embodiment of the present invention. For this exemplary embodiment, an LED package having a recessed package body 40 will be described.

Referring to FIG. 1(a), FIG. 1(b), and FIG. 2, a first single chip 10 and a second single chip 50 are mounted on a chip mounting region of the package body 40, e.g., a bottom surface of the recess. As shown in FIG. 1, the single chips 10 and 50 may be mounted on the chip mounting region and electrically connected to lead electrodes 41 and 43 of the LED package by bonding wires 45, respectively. Alternatively, the single chips 10 and 50 may be mounted together on another common substrate such as a submount (not shown), or may be flip-bonded on the submount or the chip mounting region. The single chips 10 and 50 are sealed by a molding member 47 such as epoxy or silicon. The molding member 47 may contain a phosphor and/or a diffusing agent.

Referring to FIG. 2, the first single chip 10 has a first serial array 20 of light emitting cells 18 connected in series on a first substrate 11, and the second single chip 50 has a second serial array 60 of light emitting cells 58 connected in series on a second substrate 51. Each of the first and second substrates 11 and 51 may be an insulating substrate or a conductive substrate having an insulating layer formed on a top surface thereof. The configuration and fabrication method of the first and second single chips 10 and 50 will be described in detail below.

Meanwhile, the light emitting cells 18 or 58 are connected in series by wires to form the serial array 20 or 60. Bonding pads 31 or 71 may be disposed at both ends of the serial array 20 or 60. The bonding pads 31 or 71 are electrically connected to both ends of the serial array 20 or 60. The bonding wires 45 may be bonded to the bonding pads 31 and 71.

As shown in FIG. 2, the first and second serial arrays 20 and 60 are connected in reverse parallel to each other. That is, a reverse voltage is applied to the second serial array 60 when a forward voltage is applied to the first serial array 20, and a forward voltage is applied to the second serial array 60 when a reverse voltage is applied to the first serial array 20. Therefore, when an AC power source is connected to both the ends of the first and second serial arrays 20 and 60, the first serial array 20 and the second serial array 60 are alternately operated to emit light.

Referring back to FIG. 1, the first single chip 10 emits light of a relatively short wavelength, and the second single chip 50 emits light of a relatively long wavelength. For the purpose of this description, "relatively" is used to compare the wavelength of one single chip's emitted light in reference to the other single chip's emitted light. Further examples indicating what is meant by "relatively" are provided below. The LED package may further include a phosphor for wavelength converting at least a portion of light emitted from the first single chip 10. Such a phosphor may be contained in the molding member 47 as described above. However, the present invention is not limited thereto, but the phosphor may be positioned under or above the molding member 47. The molding member 47 also contains a diffusing agent, so that light emitted from the first and second single chips 10 and 50 can be more uniformly mixed, and the light emitted from the first and second single chips 10 and 50 and the light emitted from the phosphor can be more uniformly mixed.

The mixed light of various colors, e.g., the white light can be implemented through the combination of the first and second single chips 10 and 20 and the phosphor. For example, the first single chip 10 may emit blue light, the second single chip 50 may emit red light, and the phosphor may allow a portion of the blue light emitted from the first single chip 10 to be wavelength converted into green light (or yellow light). Alternatively, the first single chip 10 may emit blue light, the second single chip 50 may emit green light, and the phosphor may allow a portion of the blue light emitted from the first single chip 10 to be wavelength converted into red light. Accordingly, the white light with excellent color reproduction characteristics can be implemented without increasing the use amount of the phosphor, thereby providing an LED package with excellent luminous efficiency.

In this embodiment, the two single chips 10 and 50 are described as mounted on the chip mounting region of the package body 40. However, a larger number of single chips may be mounted on the chip mounting region of the package body 40to be driven under an AC power.

Meanwhile, the number of the light emitting cells 18 or 58 connected in series in the first or second serial array 20 or 60may be adjusted depending on the amplitude of voltage applied to the first and second serial array 20 and 60 and the operation voltage of the light emitting cells 18 and 58. The number of the light emitting cells 18 or 58 may be determined so that the LED package can be driven, for example, under 110V or 220V that is AC power for general household usage.

Hereinafter, the configuration and fabrication method of the first and second single chips 10 and 50 will be described in detail.

Figure 3:
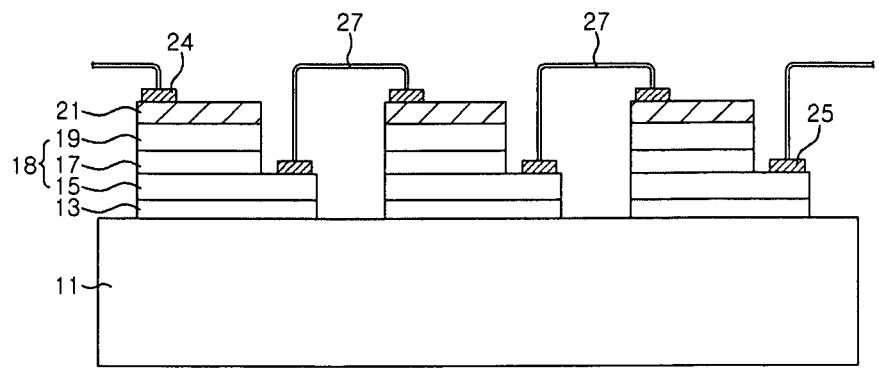
FIG. 3 and FIG. 4 are partial sectional views illustrating first single chips according to embodiments of the present invention.
Figure 4:
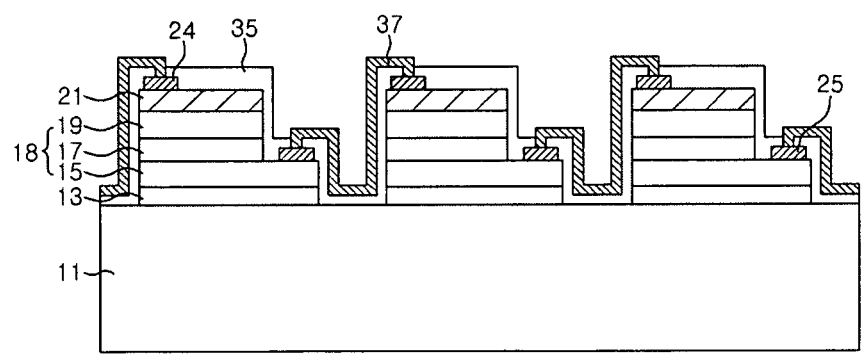

FIGS. 3 and 4 are partial sectional views illustrating first single chips according to embodiments of the present invention. Here, FIG. 3 is a partial sectional view illustrating light emitting cells connected in series by wires formed through an air bridge process, and FIG. 4 is a partial sectional view illustrating light emitting cells connected in series by wires formed through a step cover process.

Referring to FIG. 3, light emitting cells 18 are spaced apart from one another on a first substrate 11. Each light emitting cell 18 includes a first conductive-type lower semiconductor layer 15, a first active layer 17, and a second conductive-type upper semiconductor layer 19. The first active layer 17 may have a single or multiple quantum well structure, and the material and composition of the first active layer 17 may be selected depending on the desired wavelength of light. For example, the first active layer 17 may be formed of a GaN-based compound, i.e., an AlInGaN-based compound. The lower and upper semiconductor layers 15 and 19 may be formed of a material having a bandgap wider than the first active layer 17 and formed of a GaN-based compound.

Meanwhile, a buffer layer 13 may be interposed between the lower semiconductor layer 15 and the first substrate 11. The buffer layer 13 is employed to reduce lattice mismatch between the first substrate 11 and the lower semiconductor layer 15. As shown in this figure, the buffer layer 13 of one light emitting cell 18 may be spaced apart from the buffer layer 13 of an adjacent light emitting cell 18. However, the buffer layer 13 may be formed continuously throughout the light emitting cells 18 such as if the buffer layer 13 is an insulating layer or formed of a material with high resistance.

As shown in this figure, the upper semiconductor layer 19 is positioned over one region of the lower semiconductor layer 15, and the first active layer 17 is interposed between the upper and lower semiconductor layers 19 and 15. A transparent electrode layer 21 may be positioned on the upper semiconductor layer 19. The transparent electrode layer 21 may be formed of a material such as indium tin oxide (ITO) or Ni/Au.

Meanwhile, the light emitting cells 18 are electrically connected by wires 27. Each wire 27 connects a lower semiconductor layer 15 of one light emitting cell 18 to the transparent electrode layer 21 of an adjacent light emitting cell 18. As shown in this figure, the wire 27 may connect an electrode pad 24 formed on the transparent electrode layer 21 to an electrode pad 25 formed on an exposed region of the lower semiconductor layer 15. Here, the wires 27 are formed through an air bridge process, and portions except for the contact portions of the wires 27 are physically spaced apart from the first substrate 11 and the light emitting cells 18. A first serial array 20 (see FIG. 2) having the light emitting cells 18 connected in series on the first substrate 11 by the wires 27 may be formed.

Referring to FIG. 4, wires 37 to connect the light emitting cells 18 may be formed through a step cover process. That is, all the layers of the light emitting cells 18 and the first substrate except portions in contact with the wires 37 are covered with an insulating layer 35. The wires 37 are patterned on the insulating layer 35 to electrically connect the light emitting cells 18 together in series.

For example, the insulating layer 35 has openings exposing the electrode pads 24 and 25, and the wires 37 connect the electrode pads 24 and 25 of two adjacent light emitting cells 18 to each other through the openings, so that the light emitting cells 18 are connected in series.

In this embodiment, the light emitting cells 18 spaced apart from one another may be formed by sequentially growing epitaxial layers on the first substrate 11 and then patterning them using a photolithography technique. Alternatively, the light emitting cells 18 may be formed by sequentially growing epitaxial layers on a sacrificial substrate, bonding the epitaxial layers to the first substrate 11, and then removing the sacrificial substrate using a substrate separating technique. After the sacrificial substrate is separated, the light emitting cells 18 may be formed by patterning the epitaxial layers using a photolithography technique.

Figure 5:
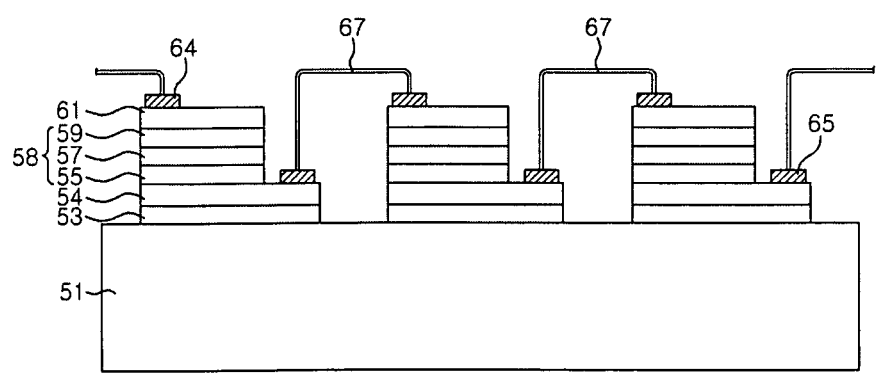
FIG. 5 and FIG. 6 are partial sectional views illustrating second single chips according to embodiments of the present invention.
Figure 6:
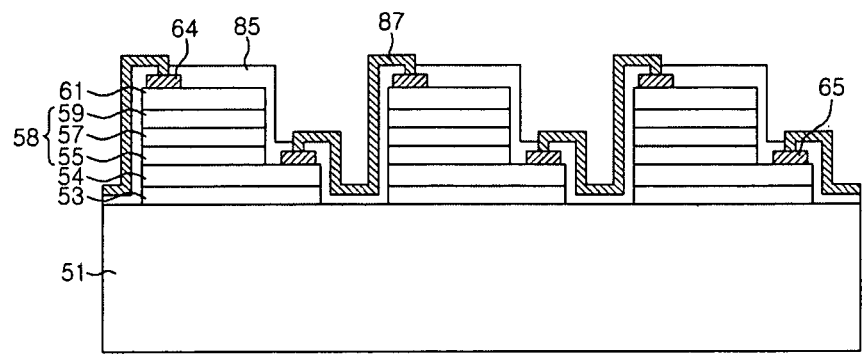

FIGS. 5 and 6 are partial sectional views illustrating second single chips according to the embodiments of the present invention.

Referring to FIG. 5, a second single chip 50 has a second substrate 51. The second substrate 51 is a single crystalline substrate suitable for growing AlInGaP epitaxial layers, and may be a GaAs or GaP substrate.

A plurality of light emitting cells 58 spaced apart from one another are positioned on the second substrate 51. Each light emitting cell 58 includes a first conductive-type lower semiconductor layer 55, a second active layer 57, and a second conductive-type upper semiconductor layer 59. The lower and upper semiconductor layers 55 and 59 may be formed of a material having a bandgap wider than the second active layer 57 and formed of an AlInGaP-based compound semiconductor. The active layer 57 may have a single or multiple quantum well structure of AlInGaP.

Meanwhile, a first conductive-type contact layer 54 may be positioned under the lower semiconductor layer 55, and one region of the first conductive-type contact layer 54 is exposed. The first conductive-type contact layer 54 may be formed of a material with specific resistivity lower than the first conductive-type lower semiconductor layer 55. Alternatively, the first conductive-type contact layer 54 may be formed of the same material as the first conductive-type lower semiconductor layer 55. In this case, the contact layer 54 and the lower semiconductor layer 55 may be formed as a single layer.

The second conductive-type upper semiconductor layer 59 is positioned on top of a portion of the first conductive-type contact layer 54, and the second active layer 57 is interposed between the upper and lower semiconductor layers 59 and 55. A window layer 61 may be positioned on the upper semiconductor layer 59. The window layer 61 may be formed of a material such as GaAsP, AlGaAs or GaP and formed of a transparent material with specific resistivity lower than the upper semiconductor layer 59. The window layer 61 may be grown on the upper semiconductor layer 59 using an epitaxial growth technique. The window layer 61 may be formed of a material having a bandgap wider than the AlInGaP active layer 57. However, in order to decrease forward voltage (Vf), the window layer 61 may be formed of a material having the same bandgap as the second active layer 57, e.g., AlInGaP.

Meanwhile, a semi-insulating buffer layer 53 may be interposed between the second substrate 51 and the light emitting cells 58. As shown in this figure, the semi-insulating buffer layer 53 of one light emitting cell 58 may be spaced apart from the semi-insulating buffer layer 53 of an adjacent light emitting cell 58. However, the semi-insulating buffer layer 53 may be formed continuously throughout the light emitting cells 58. Here, the "semi-insulating layer" generally means a high-resistance material layer having a specific resistivity of about $10^5 \Omega \cdot cm$ or more at a normal temperature, and may include an insulating material layer. If the second substrate 51 is a conductive substrate, the semi-insulating buffer layer 53 electrically insulates the second substrate 51 from the light emitting cells 58.

The semi-insulating buffer layer 53 may be formed of a III-V based material with high specific resistivity without being doped or a III-V based material doped with an electron acceptor. The electron acceptor may be a metal having monovalent or divalent electrovalence, and may be an alkaline metal, an alkaline earth metal and/or a transition metal. For example, the electron acceptor may be Fe or Cr ions.

Generally, compound semiconductor layers grown without being artificially doped are n-type conductive layers, and the electron acceptor accepts electrons in the compound semiconductor layers and increases specific resistivity to thereby form a semi-insulating layer.

Meanwhile, the light emitting cells 58 are electrically connected by wires 67. Each wire 67 connects a contact layer 54 of one light emitting cell 58 to a window layer 61 of an adjacent light emitting cell 58. As shown in this figure, the wire 67 may connect an ohmic contact layer 64 formed on the window layer 61 to an ohmic contact layer 65 formed on the exposed region of the first conductive-type contact layer 54. Here, the wires 67 are formed through an air bridge process, and portions except for the contact portions of the wires 67 are physically spaced apart from the second substrate 51 and the light emitting cells 58.

A second serial array 60 (see FIG. 2) is formed on the second substrate 51 by the wires 67.

Referring to FIG. 6, a second single chip 50 has the same components as the single second chip 50 of FIG. 5 except the structure of wires for connecting the light emitting cells 58. That is, wires 87 shown in FIG. 6 are formed through a step cover process. To this end, all layers of the light emitting cells 58 and the second substrate 51 are covered with an insulating layer 85 except for contact portions of the wires 87. The wires 87 are patterned on the insulating layer 85 to electrically connect the light emitting cells 58 together in series.

For example, the insulating layer 85 has openings exposing the ohmic contact layers 64 and 65, and the wires 87 connect the ohmic contact layers 64 and 65 of two adjacent light emitting cells 58 to each other through the openings so that the light emitting cells 58 are connected in series.

Figure 7:
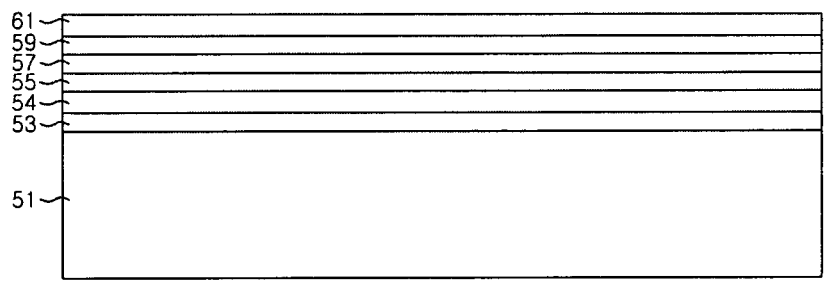
FIG. 7, FIG. 8, and FIG. 9 are sectional views illustrating a method for fabricating the second single chip according to an embodiment of the present invention.
Figure 8:
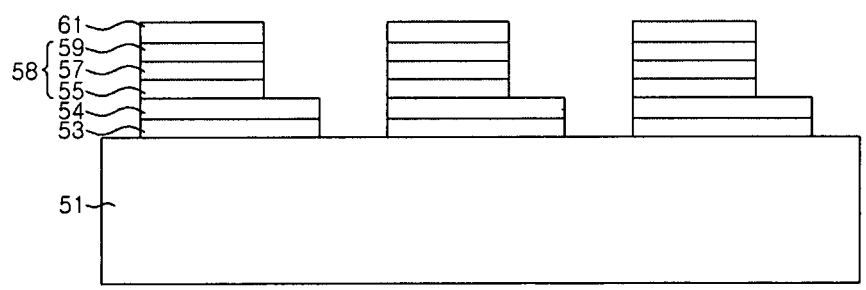
Figure 9:
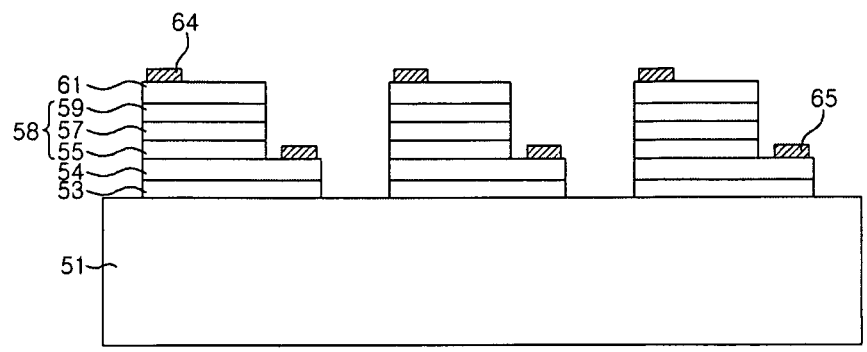

FIG. 7, FIG. 8, and FIG. 9 are sectional views illustrating a method for fabricating the second single chip according to an embodiment of the present invention.

Referring to FIG. 7, a semi-insulating buffer layer 53, a first conductive-type lower semiconductor layer 55, a second active layer 57, and a second conductive-type upper semiconductor layer 59 are grown on a second substrate 51. A first conductive-type contact layer 54 may be formed on the semi-insulating buffer layer 53, and a window layer 61 may be formed on the second conductive-type upper semiconductor layer 59.

The second substrate 51 is a single crystalline substrate suitable for growing AlInGaP epitaxial layers and may be a GaAs or GaP substrate. The semi-insulating buffer layer 53 may be formed by a metal organic chemical vapor deposition (MOCVD) technique, a molecular beam epitaxy (MBE) technique, or the like. The semi-insulating buffer layer 53 may be formed of an AlInGaP-based material or a III-V based material having a lattice coefficient similar to the AlInGaP-based material.

Meanwhile, while being formed, the semi-insulating buffer layer 53 may be doped with an acceptor. The acceptor may be a metal having monovalent or divalent electrovalence and may be an alkaline metal, an alkaline earth metal, and/or a transition metal. For example, the electron acceptor may be Fe or Cr ions.

Meanwhile, it is unnecessary to dope the semi-insulating buffer layer 53 with an electron acceptor throughout entire thickness thereof, and the semi-insulating buffer layer 53 with high specific resistivity may be formed by doping the semi-insulating buffer layer with an electron acceptor through partial thickness thereof.

The first conductive-type contact layer 54 may be formed of a material with low specific resistivity, for example an AlInGaP compound semiconductor, for the purpose of current distribution. All of the first conductive-type lower semiconductor layer 55 and the second conductive-type upper semiconductor layer 59 may be formed of an AlInGaP compound semiconductor and are formed of a material having a bandgap wider than the second active layer 57 by controlling the composition ratio of Al, Ga and/or In. The lower and upper semiconductor layers 55 and 59 and the active layer 57 may be formed using an MOCVD or MBE technique.

Meanwhile, the window layer 61 may be formed of a material with low specific resistivity, e.g., GaAsP, AlGaAs or GaP, which also transmits light generated from the second active layer 57. Alternatively, the window layer 61 may be formed of a material having the same bandgap as the second active layer 57, e.g., AlInGaP. The window layer 61 may be grown on the upper semiconductor layer 59 using an epitaxial growth technique. If the window layer 61 is formed of a material having the same bandgap as the second active layer 57, forward voltage (Vf) can be lowered.

Referring to FIG. 8, the light emitting cells 58 are separated by patterning the window layer 61, the second conductive-type upper layer 59, the second active layer 57, the first conductive-type lower semiconductor layer 55, the first conductive-type contact layer 54, and the semi-insulating buffer layer 53, and one region of the first conductive-type contact layer 54 is then exposed. As a result, the light emitting cells 58 having the exposed first conductive-type contact layer 54 are formed.

Referring to FIG. 8, an ohmic contact layer 64 is formed on the window layer 61, and an ohmic contact layer 65 is formed on the exposed first conductive-type contact layer 54. The ohmic contact layer 64 is ohmic-contacted with the window layer 61, and the ohmic contact layer 65 is ohmic-contacted with the first conductive-type contact layer 54.

Thereafter, wires 67 (see FIG. 5) for electrically connecting the light emitting cells 58 are formed through an air bridge process. The wires 67 connect the light emitting cells 58 together, thereby forming a second serial array 60.

Meanwhile, the wires 87 for connecting the light emitting cells 58 may be formed through a step cover process, and the second single chip 50 of FIG. 6 is completed accordingly. That is, after the ohmic contact layers 64 and 65 of FIG. 9 are formed, an insulating layer 85 (see FIG. 6) is formed on the entire surface of the second substrate 51. The insulating layer 85 may be formed of $SiO_2$, for example. Subsequently, openings exposing the ohmic contact layers 64 and 65 are formed by patterning the insulating layer 85. Thereafter, wires 87 are formed on the insulating layer 85 using a plating or deposition technique, so that the light emitting cells 58 are electrically connected together.

Figure 10:
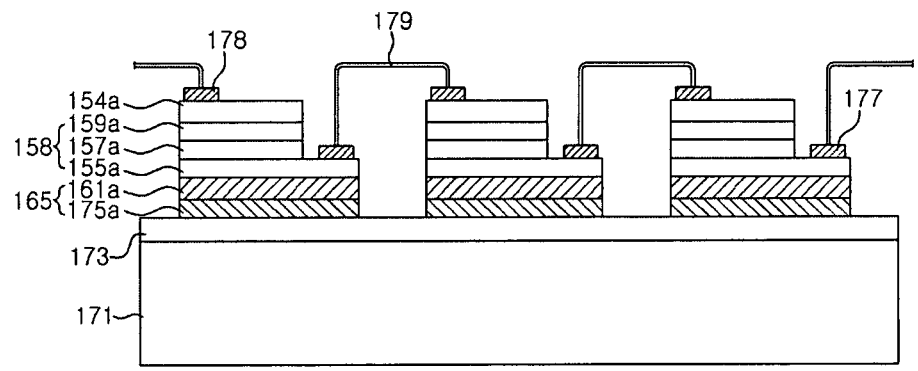
FIG. 10 and FIG. 11 are partial sectional views illustrating second single chips according to other embodiments of the present invention.
Figure 11:
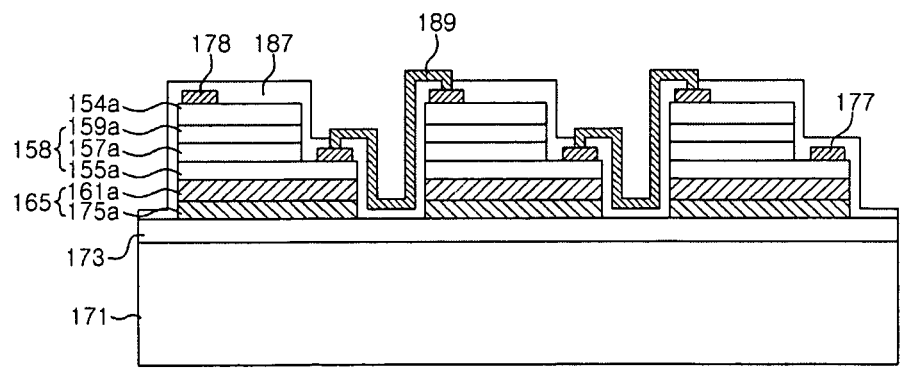

FIGS. 10 and 11 are partial sectional views illustrating second single chips according to other embodiments of the present invention.

Referring to FIG. 10, a second single chip 50 includes a base substrate 171 as a second substrate. In this embodiment, the base substrate 171 is not necessarily a single crystalline substrate suitable for growing AlInGaP epitaxial layers but may be a conductive substrate such as a metal substrate or GaP substrate.

Metal patterns 165 are spaced apart from one another on the base substrate 171. The metal patterns 165 may include a reflective metal layer 161a and an adhesive metal layer 175a, which are both described in more detail below. An insulating layer 173 is interposed between the base substrate 171 and the metal patterns 165 thereby electrically insulating the metal patterns 165 from the base substrate 171. Light emitting cells 158 are positioned on the metal patterns 165, respectively. Each light emitting cell includes a first conductive-type lower semiconductor layer 155a, a second active layer 157a, and a second conductive-type upper semiconductor layer 159a.

The lower and upper semiconductor layers 155a and 159a are formed of a material having a bandgap wider than the second active layer 157a and may be formed of an AlInGaP-based compound semiconductor. The second active layer 157a may have a single or multiple quantum well structure of AlInGaP.

Meanwhile, as shown in this figure, the upper semiconductor layer 159a may be positioned on a portion of the lower semiconductor layer 155a so that one region of the lower semiconductor layer 155a is exposed, and the second active layer 157a may be interposed between the lower and upper semiconductor layers 155a and 159a. Alternatively, the semiconductor layers 155a and 159a may be positioned on some portions of the metal patterns 165 so that some regions of the metal patterns 165 are exposed.

Meanwhile, a window layer 154a may be positioned on the second conductive-type upper semiconductor layer 159a. The window layer 154a may be formed of a material such as GaAsP, AlGaAs or GaP and formed of a transparent material having specific resistivity lower than the upper semiconductor layer 159a. The window layer 154a may be grown using an epitaxial growth technique. The window layer 154a may be formed of a material having a bandgap wider than the second active layer 157a. However, in order to decrease forward voltage (Vf), the window layer 154a may be formed of a material having the same bandgap as the second active layer 157a.

In the meantime, the light emitting cells 158 are electrically connected by wires 179. Each wire 179 connects a lower semiconductor layer 155a of one light emitting cell 158 to the window layer 154a of an adjacent light emitting cell 158. As shown in this figure, each wire 179 may connect an ohmic contact layer 178 formed on the window layer 154a to an ohmic contact layer 177 formed on an exposed region of the first conductive-type lower semiconductor layer 155a. If the metal patterns 165 are exposed, a wire 179 may connect an ohmic contact layer 178 of one light emitting cell 158 to a metal pattern 165 of an adjacent light emitting cell 158. Here, the wires 179 are formed through an air bridge process, and portions except for the contact portions of the wires 179 are physically spaced apart from the base substrate 171 and the light emitting cells 158.

Referring to FIG. 11, a second single chip 50 of this embodiment has the same components as the second single chip 50 of FIG. 10 except the structure of wires 189 for connecting the light emitting cells 158. That is, wires 189 according to this embodiment are formed through a step cover process. To this end, all the layers of the light emitting cells 158 and the base substrate 171 are covered with an insulating layer 187 except for the contact portions of the wires 189. The wires 189 are patterned on the insulating layer 187 to electrically connect the light emitting cells 158 together in series.

For example, the insulating layer 187 has openings exposing the ohmic contact layer 178 and the ohmic contact layer 177 or the metal pattern 165, and a wire 189 connects two adjacent light emitting cells 158 in series.

FIG. 12, FIG. 13, FIG. 14, and FIG. 15 are sectional views illustrating a method for fabricating the second single chip according to another embodiment of the present invention.

Figure 12:
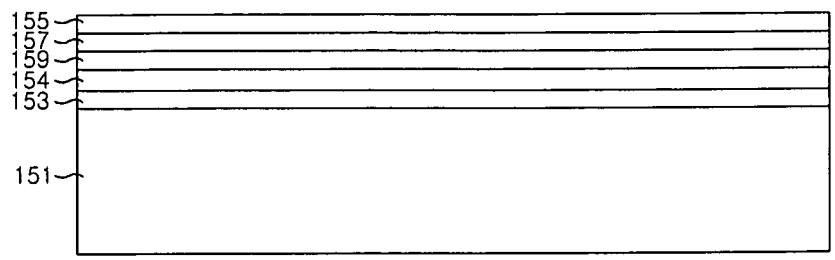
FIG. 12, FIG. 13, FIG. 14, and FIG. 15 are sectional views illustrating a method for fabricating the second single chip according to another embodiment of the present invention.

Referring to FIG. 12, semiconductor layers including a first conductive-type semiconductor layer 155, a second conductive-type semiconductor layer 159, and a second active layer 157 interposed between the first and second conductive-type semiconductor layers 155 and 159 are formed over a sacrificial substrate 151. The semiconductor layers may have a buffer layer 153 formed on the sacrificial substrate 151, and a window layer 154 may be formed before the second conductive-type semiconductor layer 159 is formed.

The sacrificial substrate 151 is a single crystalline substrate having a lattice coefficient suitable for growing an AlInGaP-based epitaxial layer. The sacrificial substrate 151 may be a GaAs or GaP substrate. The buffer layer 153 may be formed using an MOCVD technique, a MBE technique, or the like. The buffer layer 153 may be formed of an AlInGaP-based material or a III-V based material having a lattice coefficient similar to the AlInGaP-based material.

Meanwhile, the first conductive-type semiconductor layer 155, the second active layer 157 and the second conductive-type semiconductor layer 159 may be formed of an AlInGaP-based compound semiconductor. The first and second conductive-type semiconductor layers 155 and 159 are formed of a material having a bandgap wider than the second active layer 157 by controlling the composition ratio of Al, Ga and/or In. The first and second conductive-type semiconductor layers 155 and 159 and the active layer 157 may be formed using an MOCVD or MBE technique.

The window layer 154 may be formed of a material with low specific resistivity, e.g., GaAsP, AlGaAs or GaP, which also transmits light generated from the second active layer 157. In order to decrease forward voltage (Vf), the window layer 154 may be formed of a material having the same bandgap as the second active layer 157. The window layer 154 may be grown using an epitaxial growth technique before the second conductive-type semiconductor layer 159 is grown.

Figure 13:
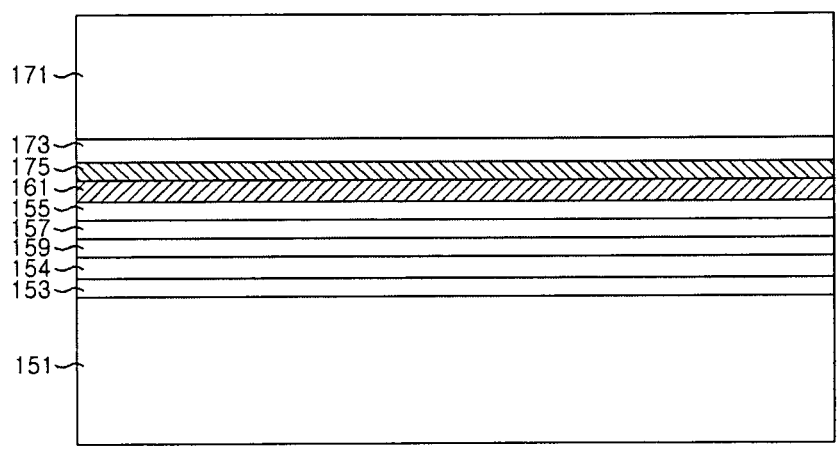

Referring to FIG. 13, a base substrate 171 as a second substrate is prepared separately from the sacrificial substrate 151, and an insulating layer 173 is formed on the base substrate 171. The base substrate 171 is employed to enhance luminous efficiency of the second single chip 50. Particularly, the base substrate 171 may be a conductive substrate with high thermal conductivity. In some embodiments, the base substrate 171 may be a transmissive substrate. The insulating layer 173 may be an oxide layer such as $SiO_2$ or a semi-insulating layer.

Thereafter, the insulating layer 173 and the semiconductor layers are bonded to face each other. The insulating layer 173 may be directly bonded to the semiconductor layers. Alternatively, the insulating layer 173 may be bonded to the semiconductor layers through an adhesive metal layer 175 interposed between the insulating layer 173 and the semiconductor layers. A reflective metal layer 161 made of Ag or Al may be interposed between the adhesive metal layer 175 and the semiconductor layers. The adhesive metal layer 175 may be formed on the semiconductor layers and/or the insulating layer 173, and the reflective metal layer 161 may be formed on the semiconductor layers. A diffusion barrier layer (not shown) may also be interposed between the adhesive metal layer 175 and the reflective metal layer 161. The diffusion barrier layer prevents the reflexibility of the reflective metal layer 161 from being decreased due to the diffusion of metal elements from the adhesive metal layer 175 into the reflective metal layer 161.

Figure 14:
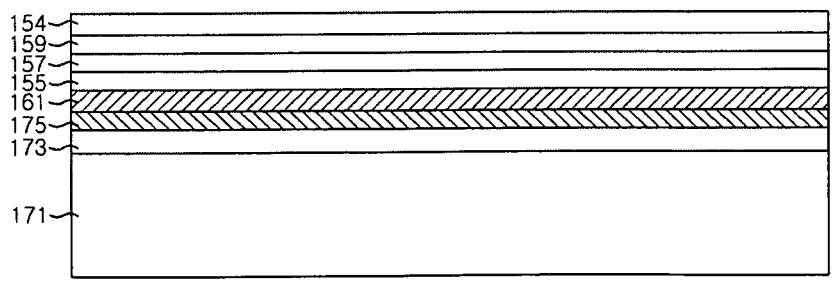

Referring to FIG. 14, the sacrificial substrate 151 is separated from the semiconductor layers. The sacrificial substrate 151 may be separated from the semiconductor layers by wet or dry etching, polishing, ion milling or combination thereof The buffer layer 153 may also be removed.

After the insulating layer 173 and the semiconductor layers are bonded together, the sacrificial substrate 151 may also be separated. Alternatively, the sacrificial substrate 151 may be separated before the insulating layer 173 and the semiconductor layers are bonded to each other. In this case, the insulating layer 173 may be bonded to the semiconductor layer having a surface separated from the sacrificial substrate 151. Alternatively, after another sacrificial substrate (not shown) is first bonded to the semiconductor layers, the sacrificial substrate 151 may be removed, and the insulating layer 173 of the base substrate 171 may be bonded to the semiconductor layers. Thereafter, the other sacrificial layer is separated. If the insulating layer 173 is bonded to the semiconductor layer having the surface separated from the sacrificial substrate 151, the window layer 154 is positioned on the first conductive-type semiconductor layer 155.

Figure 15:
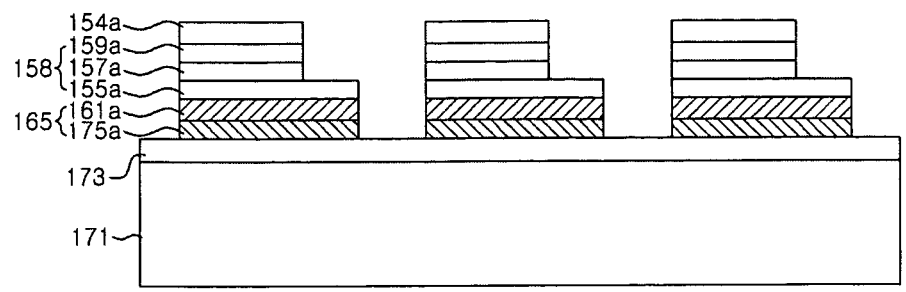

Referring to FIG. 15, light emitting cells 158 spaced apart from one another are formed by patterning the semiconductor layers. Each light emitting cell 158 includes a patterned first conductive-type lower semiconductor layer 155a, a patterned second active layer 157a, and a patterned second conductive-type upper semiconductor layer 159a. Each light emitting cell 158 may also have a patterned window layer 154a. The semiconductor layers may be patterned using a photolithography technique.

If the adhesive metal layer 175 or the reflective metal layer 161 or both are interposed between the semiconductor layers, they are also patterned, thereby forming metal patterns 165 spaced apart from one another. As shown in this figure, the patterned first conductive-type lower semiconductor layer 155a may be formed so that one region of the first conductive-type lower semiconductor layer 155a is exposed. However, if the metal patterns 165 are formed, portions of the metal patterns 165 are exposed, and the one region of the first conductive-type lower semiconductor layer 155a may not be exposed.

Referring back to FIG. 10, an ohmic contact layer 178 is formed on the window layer 154a, and an ohmic contact layer 177 is formed on the exposed first conductive-type lower semiconductor layer 155a. The ohmic contact layer 178 is ohmic-contacted with the window layer 154a, and the ohmic contact layer 177 is ohmic-contacted with the first conductive-type lower semiconductor layer 155a. If portions of the metal patterns 165 are exposed, the ohmic contact layer 177 may be omitted. In this case, the metal patterns 165 are in ohmic-contact with the first conductive-type lower semiconductor layer 155a.

Thereafter, wires 179 for electrically connecting the light emitting cells 158 may be formed through an air bridge process. The light emitting cells are connected by the wires 179, thereby forming a second serial array 60.

Alternatively, the wires 189 for connecting light emitting cells 158 may be formed through a step cover process, and the second single chip 50 of FIG. 11 is completed accordingly. That is, after the ohmic contact layers 177 and 178 of FIG. 10 are formed, an insulating layer 187 is formed over the entire surface of the base substrate 171. Subsequently, openings exposing the ohmic contact layers 177 and 178 are formed by patterning the insulating layer 187. Thereafter, wires 189 are formed on the insulating layer 187 using a plating or deposition technique, so that the light emitting cells 158 are electrically connected together in series.

In the embodiments of the present invention, it has been described that the first single chip 10 is formed of an AlInGaN-based compound and the second single chip 50 is formed of an AlInGaP-based compound. However, the present invention is not limited thereto. For example, the second single chip 50 may be formed of an AlInGaN-based compound having a composition different from that of the first single chip 10.

In addition, although it has been described in the embodiments of the present invention that the first and second single chips 10 and 50 are mounted in the LED package, a third single chip may be mounted together with the first and second single chips 10 and 50. The third single chip may have a third serial array of light emitting cells emitting light of a wavelength different from those of the first and second single chips. For example, the first single chip 10 may emit blue light, the second single chip 50 may emit red light, and the third single chip may emit green light. Accordingly, white light can be implemented under AC power without using a phosphor. The third single chip may be connected in series with or parallel to the first or second single chip 10 or 50.

According to the embodiments of the present invention, an LED package includes serial arrays emitting light of different wavelengths that are mounted to emit mixed-color light and to be driven under high-voltage AC power. In addition, an LED package capable of implementing white light with excellent color reproduction characteristics and luminous efficiency by combining the serial arrays and a phosphor is provided.

Although the present invention has been described with reference to the embodiments and the accompanying drawings, the invention is not limited to the embodiments and the drawings. It should be understood that various modifications and changes can be made by those skilled in the art without departing from the spirit and scope of the present invention as defined by the accompanying claims.

What is claimed is:

1. A light emitting diode (LED) package, comprising:
   a first serial array comprising light emitting cells of a first type but not a second type arranged on a first substrate to emit light of a relatively short wavelength; and
   a second serial array comprising light emitting cells of the second type but not the first type arranged on a second substrate to emit light of a relatively long wavelength,
   wherein the first serial array and the second serial array are connected in reverse parallel.

2. The LED package as claimed in claim 1, further comprising:
   a phosphor to wavelength-convert at least a portion of the light emitted from the first serial array.

3. The LED package as claimed in claim 2, wherein the light emitting cells in the first serial array emit blue light, the light emitting cells in the second serial array emit red light, and the phosphor wavelength-converts the blue light into green light.

4. The LED package as claimed in claim 3, further comprising:
   a molding member covering the first serial array and the second serial array,
   wherein the molding member comprises a diffusing agent.

5. The LED package as claimed in claim 2, wherein the light emitting cells in the first serial array emit blue light, the light emitting cells in the second serial array emit green light, and the phosphor wavelength-converts blue light into red light.

6. The LED package as claimed in claim 5, further comprising:
   a molding member covering the first serial array and the second serial array,
   wherein the molding member comprises a diffusing agent.

7. The LED package as claimed in claim 1, wherein each light emitting cell in the first serial array comprises:
   a first conductive-type semiconductor layer,
   a second conductive-type semiconductor layer, and
   a first active layer interposed therebetween;

each light emitting cell in the second serial array comprises:
a first conductive-type semiconductor layer,
a second conductive-type semiconductor layer, and
a second active layer interposed therebetween,
and
the first active layer is formed of an AlInGaN-based compound, and the second active layer is formed of an AlInGaP-based compound.

8. The LED package as claimed in claim 1, wherein a first bonding pad is disposed at an end of the first serial array and a second bonding pad is disposed at an end of the second serial array.

9. The LED package as claimed in claim 1, further comprising a third serial array comprising light emitting cells emitting light of a wavelength different from the first serial array and the second serial array,
wherein the third serial array is connected in series or in parallel to the first serial array and the second serial array.

* * * * *